(12) United States Patent
Ratcliffe (10) Patent No.: US 6,250,775 B1
(45) Date of Patent: Jun. 26, 2001

(54) LIGHT-EMITTING DIODE DISPLAY SYSTEMS AND METHODS WITH ENHANCED LIGHT INTENSITY

(75) Inventor: William R. Ratcliffe, Thousand Oaks, CA (US)

(73) Assignee: Marpole International, Inc., Hong Kong (CN)

( * ) Notice: Subject to any disclaimer, the term of this patent is extended or adjusted under 35 U.S.C. 154(b) by 0 days.

(21) Appl. No.: 09/458,465

(22) Filed: Dec. 9, 1999

(51) Int. Cl.$^7$ ....................................................... F21V 7/00
(52) U.S. Cl. ........................ 362/252; 362/551; 362/235; 362/800
(58) Field of Search .................................. 362/249, 235, 362/247, 252, 551, 800; 313/283, 284, 257, 512

(56) References Cited

U.S. PATENT DOCUMENTS

| | | | |
|---|---|---|---|
| 4,301,616 | 11/1981 | Gudgel | 46/228 |
| 4,725,128 | 2/1988 | Bornzin | 350/320 |
| 5,521,799 | * 5/1996 | VerKamp | 362/225 |
| 5,564,819 | * 10/1996 | Yamaguchi | 362/241 |
| 5,813,148 | 9/1998 | Guerra | 36/137 |

OTHER PUBLICATIONS

Markus, John, et al., *McGraw Hill Electronics Dictionary*, McGraw–Hill, Inc, New York, fifth edition, 1994, definition of interdigital structure.

*Mirriam Webster's Collegiate Dictionary*, Merriam–Webster, Inc, Springfield, Mass., tenth edition, 1993, definition of interdigitate.

Graf, Rudolf F., *Modern Dictionary of Electronics*, Macmillan Computer Publishing, Carmel, Indiana, sixth edition, 1991 definition of interdigital transducer.

Zanger, Harry, et al.,*Fiber Optics, Communications and Other Applications*, Macmillan Publishing, New York, 1991, pp. 179–182 and 250–252.

* cited by examiner

Primary Examiner—Thomas M. Sember
(74) Attorney, Agent, or Firm—Koppel & Jacobs

(57) ABSTRACT

Light-emitting diode display systems are provided which have enhanced light intensity. The enhanced intensity is realized with first and second electrodes, a plurality of light-emitting diodes and a reflector. The first and second electrodes respectively form first and second sets of first and second fingers respectively wherein the first and second fingers are arranged in an interdigitated relationship. Each of the light-emitting diodes is coupled between a respective one of the first fingers and a respective one of the second fingers and the reflector is arranged and positioned to reflect light from the light-emitting diodes. A plurality of diodes are thus positioned so that the reflector combines their light into a beam of enhanced intensity.

33 Claims, 7 Drawing Sheets

LIGHT-EMITTING DIODE DISPLAY SYSTEMS AND METHODS WITH ENHANCED LIGHT INTENSITY

BACKGROUND OF THE INVENTION

1. Field of the Invention

The present invention relates generally to light display systems and, more particularly, to light-emitting diode display systems.

2. Description of the Related Art

Incandescent and fluorescent lights (typically referred to as "neon lights") are used in great quantities to form advertising signs, billboards, shop signs, window displays and the like. Although fluorescent tubes, in particular, are provided in various attractive colors and can be arranged in a variety of light display forms (e.g., letters and numbers), they require high voltages (e.g., 12,000–20,000 volts), are extremely fragile, require substantial support to decrease breakage and are expensive to fabricate.

In contrast, light-emitting diode display systems are available in various colors and operate with low voltages. They have been combined with optical fibers to simulate fluorescent tubes and this combination is comparatively rugged and relatively simple to fabricate. Conventional light-emitting diode display systems, however, typically generate light with single-diode units that utilize bond wires in their assembly. This structure limits the emitted intensity of these systems and, accordingly, it has limited their acceptance as light display systems.

SUMMARY OF THE INVENTION

The present invention is directed to light-emitting diode display systems which have enhanced light intensity. In one display embodiment, the enhanced intensity is realized with first and second electrodes, a plurality of light-emitting diodes and a reflector. The first and second electrodes respectively form first and second sets of first and second fingers respectively wherein the first and second fingers are arranged in an interdigitated relationship.

Each of the light-emitting diodes is coupled between a respective one of the first fingers and a respective one of the second fingers and the reflector is arranged and positioned to reflect light from all of the light-emitting diodes. The reflected light combines the emission of all diodes and, accordingly, its intensity is substantially enhanced.

In another light display embodiment, an optical fiber is coupled to the reflector and preferably arranged to form at least one light display form (e.g., a letter and/or number). Emission light intensity from the fiber is enhanced with elongate light-emission structures (e.g., elongate reflectors and elongate cladding perturbations) that facilitate light propagation through the fiber's cladding.

In another light display embodiment, a plurality of light displays are each formed of first and second interdigitated electrodes, a plurality of light-emitting diodes and a reflector. The light displays are coupled between first and second master electrodes so that they can be simultaneously or selectively activated.

The novel features of the invention are set forth with particularity in the appended claims. The invention will be best understood from the following description when read in conjunction with the accompanying drawings.

DETAILED DESCRIPTION OF THE PREFERRED EMBODIMENTS

FIGS. 1–5C illustrate a light display system embodiment 20 of the present invention that generates and displays light emissions with enhanced intensity.

Figure 1:
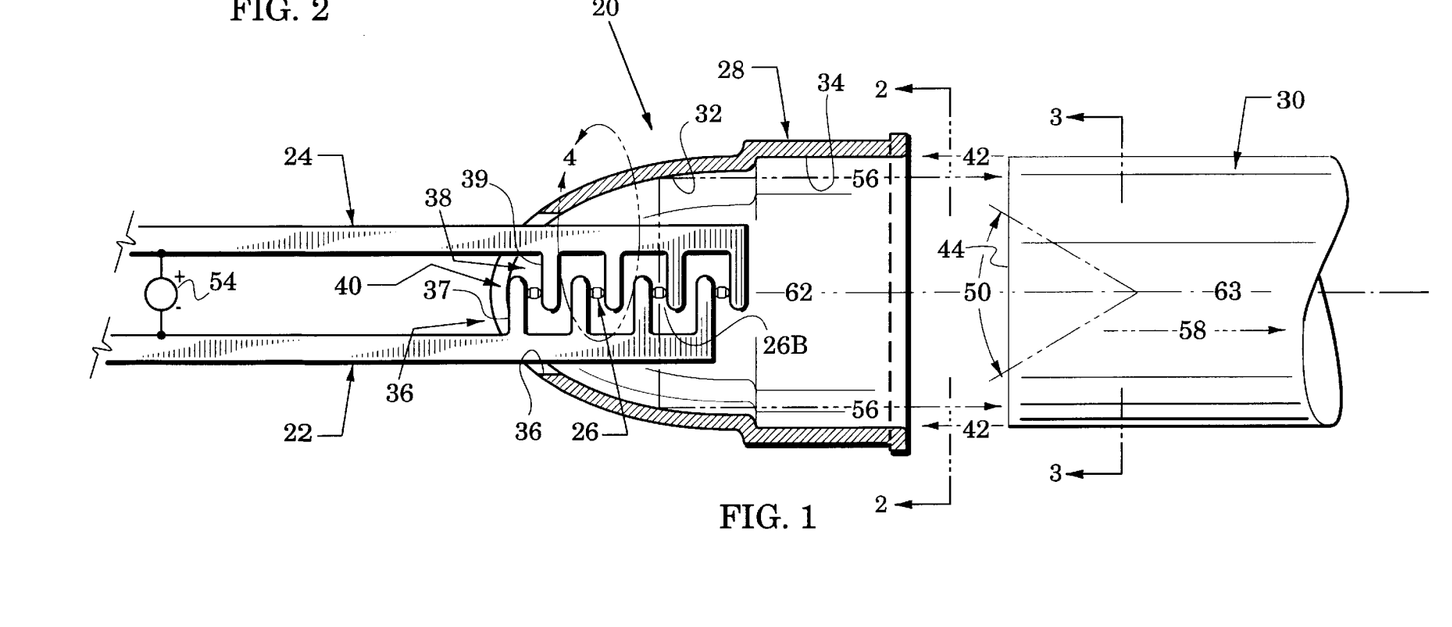
FIG. 1 is a partially-sectioned side view of a light display system embodiment of the present invention.

As shown in FIG. 1, the light display system 20 includes first and second electrodes 22 and 24, a plurality of light-emitting diodes 26, a reflector 28 and an optical fiber 30. The reflector 28 is arranged to form a reflecting chamber 32 and an annular collar 34 that joins the reflecting chamber. The reflecting chamber 32 defines an aperture 36 that receives the first and second electrodes 22 and 24 and an end of the optical fiber 30 is received into the annular collar 34.

FIG. 1 further illustrates that the first and second electrodes 22 and 24 respectively form first and second sets 36 and 38 of first and second fingers 37 and 39 respectively and the fingers are arranged in an interdigitated relationship 40. Each of the light-emitting diodes 26 is coupled to a respective one of the first fingers 37 and a respective one of the second fingers 39.

Figure 4:
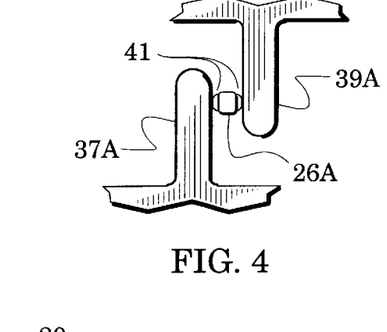
FIG. 4 is an enlarged view of structure within the curved line 4 of FIG. 1.

For example, the enlarged view of FIG. 4 shows an exemplary light-emitting diode 26A coupled between a first finger 37A and a second finger 39A. The anode and cathode of the light-emitting diode 26A are electrically coupled to the fingers with a conductive medium 41 (e.g., solder or a conductive epoxy) that also provides structural support.

Figure 2:
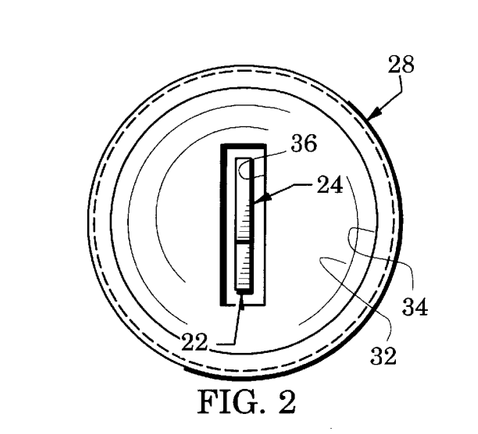
FIGS. 2 and 3 are views along the planes 2—2 and 3—3 of FIG. 1.

In the light display system 20, the first and second electrodes 22 and 24 have a thin rectangular cross section so that the aperture 36 also has a thin rectangular shape that is large enough (as shown in FIG. 2) to receive the electrodes without shorting them together. As shown in FIG. 1, the first and second electrodes 22 and 24 are inserted into the aperture by a distance that positions all of the light-emitting diodes 26 within the reflecting chamber 32 but that does not cause the electrodes to intrude into the annular collar 34.

Figure 3:
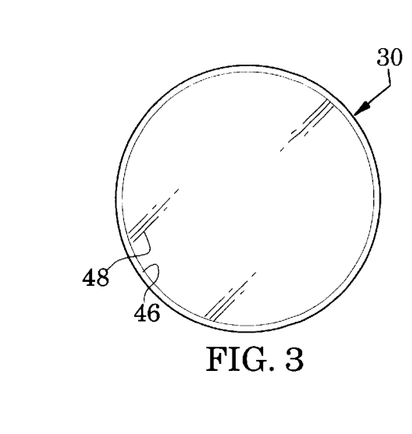

Accordingly, the optical fiber 30 can be inserted (indicated by insertion arrows 42) into the collar 34 to position the fiber's face 44 proximate to the end of the interdigitated fingers. As seen in FIG. 3, the optical fiber 30 has a cladding 46 that surrounds a fiber core 48. This structure causes the fiber 30 to receive and transmit any light rays that fall within an acceptance angle 50 that is shown in association with the fiber face 44 in FIG. 1.

Figure 5A:
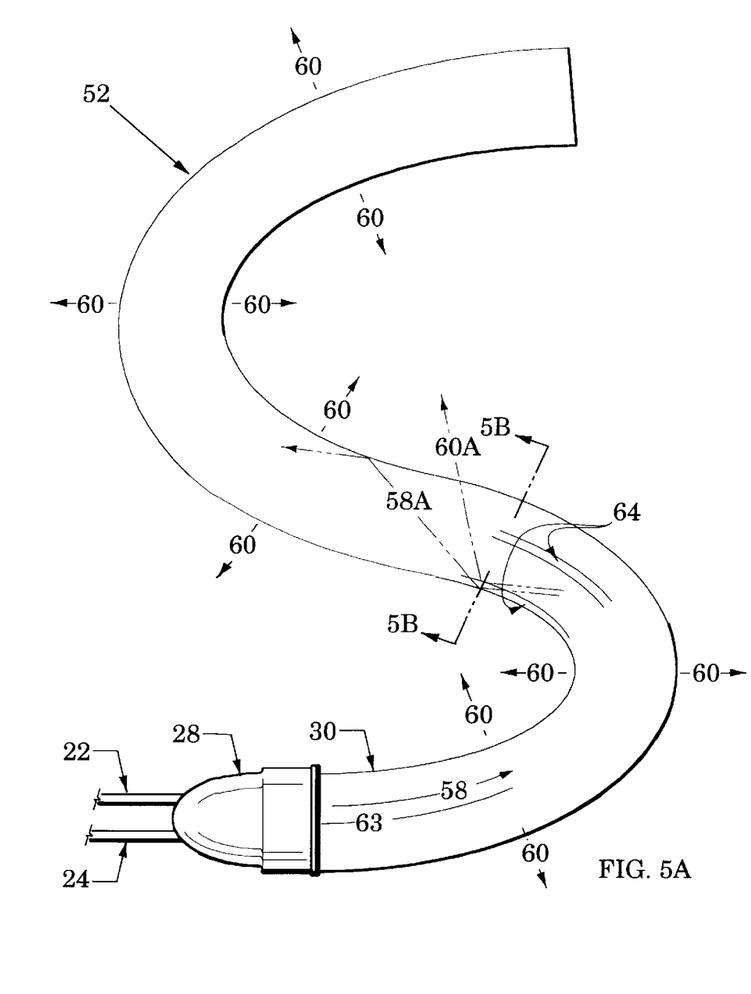
FIG. 5A is a reduced-scale view that illustrates an optical fiber of the light display system of FIG. 1 configured as a display letter.

The optical fiber 30 is typically arranged to have a predetermined light display form 52. For example, FIG. 5 shows that the optical fiber 30 is arranged as an exemplary alphabetical letter (in particular, the letter S).

In operation of the light display system 20, a biasing voltage (54 in FIG. 1) is communicated towards the light-emitting diodes 26 via the the first and second electrodes 22 and 24. The first and second sets of interdigitated fingers 37 and 39 couple this biasing voltage across each of the light-emitting diodes, The polarity of the voltage is arranged to forward bias the light-emitting diodes 26 so that they emit light as exemplified by light rays 56 from an exemplary light-emitting diode 26B in FIG. 1.

The reflector 28 is configured so that substantially all of the light rays from all of the diodes 26 form a composite light beam. In particular, it is configured so that they are reflected from the walls of the reflecting chamber 32 as a and traverse the face 44 of the optical fiber 30 at an angle less than the fiber's acceptance angle 50. Therefore, a substantial portion of the light of the entire set of the light-emitting diodes 26 enters and is transmitted along the optical fiber 30 as indicated by an exemplary transmission ray 58 in FIGS. 1 and 5A. As the light is transmitted along the optical fiber 30, portions of it are emitted through the cladding of the optical fiber 30 so as to illuminate the light display form 52. The emitted light is indicated by emission light rays 60 in FIG. 5A.

The light display system 20 preferably includes several features that enhance the intensity of the emission light rays 60. In a first feature, the first and second fingers 37 and 39 of FIG. 1 extend sufficiently into the interdigitated relationship 40 so that the light-emitting diodes 26 can be positioned on a common axis 62 (i.e., positioned coaxially) and this axis is preferably positioned coaxially with the axis 63 of the optical fiber 30.

In another feature, the reflecting chamber 32 is configured so that substantially all of the emitted light from the diodes 26 falls within the acceptance angle 50 of FIG. 1 and is transmitted along the optical fiber 30. An exemplary reflecting chamber is formed to have a parabolic shape so that light emitted from the parabolic focus is collimated. Although only one of the light-emitting diodes 26 can be positioned at the parabolic focus, the others are sufficiently near to cause their emitted light rays to fall within the acceptance angle 50.

Figure 5B:
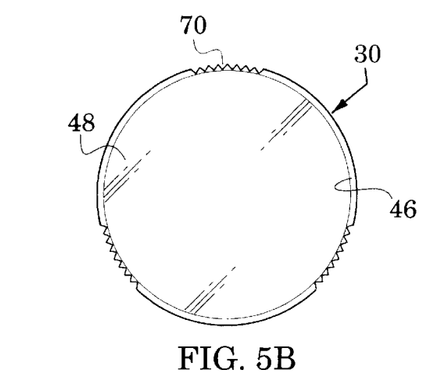
FIGS. 5B and 5C are sectional views along the plane 5B—5B of FIG. 5A.
Figure 5C:
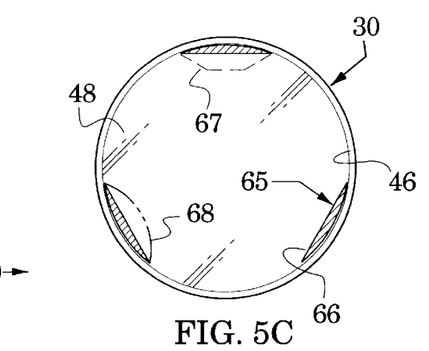

FIGS. 5A–5C illustrate another feature in which the optical fiber 30 is modified to include elongate light-emission structures 64 that facilitate conversion of the transmission light rays 58 into emission light rays 60 which enhance the light intensity of the light display form 52. FIG. 5B shows that one light-emission structure embodiment is formed with elongate reflective ribbons 65 that have a reflective face 66 and are positioned proximate to the cladding 46.

FIG. 5A shows an exemplary transmission ray 58A that is propagated down the optical fiber 30 because its angle from the axis 63 does not exceed the fiber's critical propagation angle. The reflective face 66 alters the curved face of the cladding 46 and thereby alters the path of the transmission ray 58A to exceed the critical propagation angle. Accordingly, the transmission ray is emitted through the fiber cladding as an emission ray 60A. Various other planar and nonplanar faces (e.g., the planar faces 67 and curved face 68 of FIG. 5B) can be similarly employed. Optical fibers with elongate reflective ribbons are obtainable from various light display sources (e.g., Bridgestone Engineered Products Company, Nashville, Tenn., 37217 and Poly Optical Products, Inc., Irvine, Calif., 92614).

FIG. 5C shows that another light-emission structure embodiment is formed with elongate perturbations 70 in the cladding 46. These perturbations 70 (e.g., pluralities of elongate perturbations having planar and/or nonplanar faces) alter the fiber's critical propagation angle so as to enhance light emission through the fiber.

Although the light display system 20 of FIGS. 1–5C can be scaled to various dimensions, an exemplary system uses optical fibers having a diameter on the order of 6 to 7 millimeters. The light-emitting diodes 26 are preferably any of various conventional light-emitting diode chips that are obtainable from a variety of sources (e.g., EO series of light-emitting diode chips, Opto Tech Corporation, Taiwan, Republic of China) and that are configured to emit light of various colors from various diode surfaces (e.g., top and edge surfaces). Different diodes emit light over different included angles. If these included angles are less than 360°, the diodes 26 of FIG. 1 can be rotated so that each illuminates a different sector of the reflecting chamber 32. The first and second electrodes 22 and 24 can be fixed to the reflector with various conventional insulative epoxys.

Figure 6A:
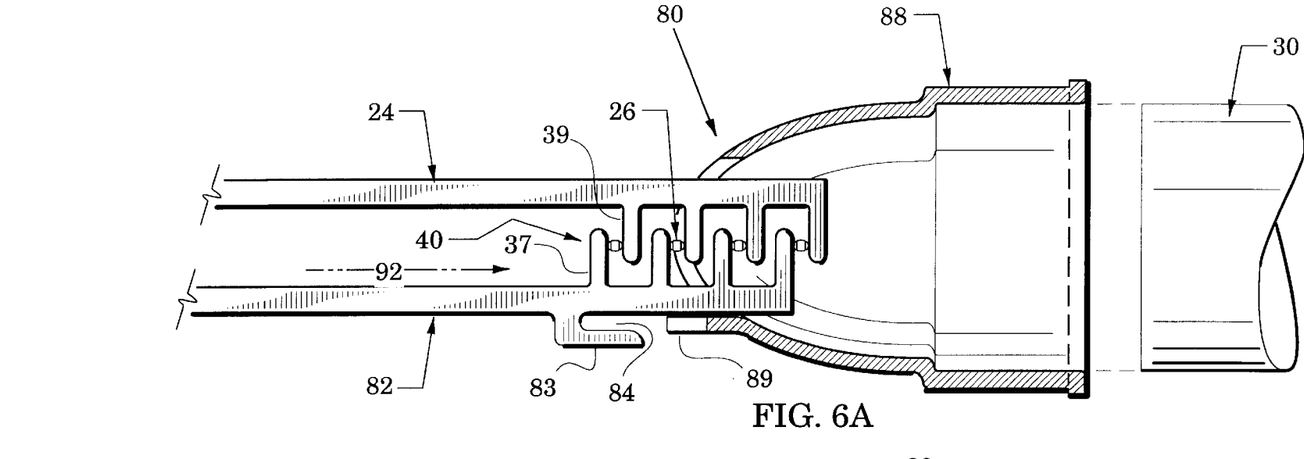
FIG. 6A is a partially-sectioned side view of another light display system embodiment.
Figure 6B:
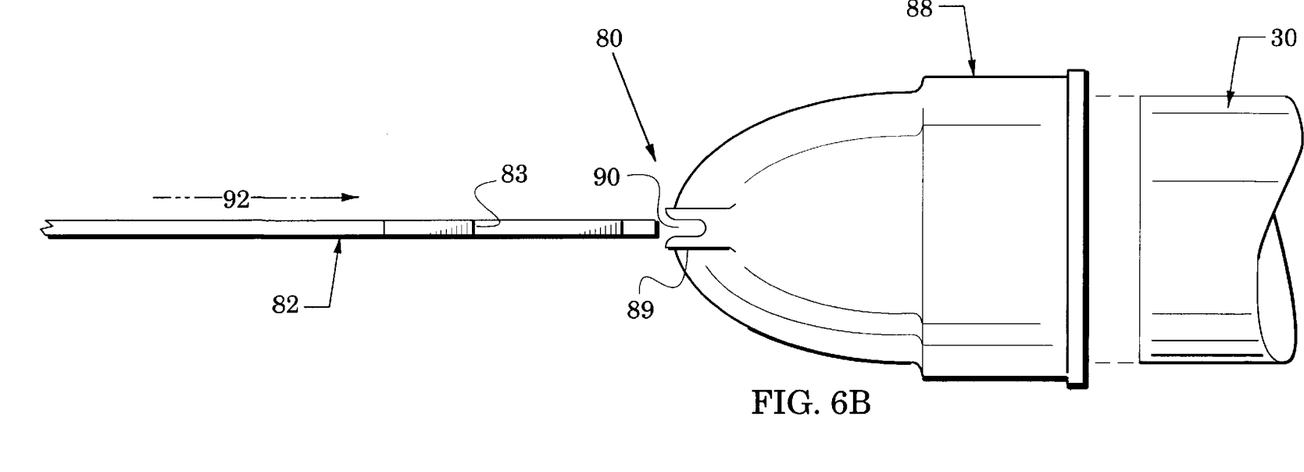
FIG. 6B is a bottom view of the light display system of FIG. 6A.

FIGS. 6A and 6B illustrate another light display embodiment 80 which is similar to the light display 20 of FIG. 1 with like elements indicated by like reference numbers. However, the light display 80 has a first electrode 82 that is similar to the first electrode 22 of FIG. 1 but includes a first tab 83. The light display 80 also has a reflector 88 that is similar to the reflector 28 of FIG. 1 but includes a second tab 89 that lies proximate to the aperture 36.

The tabs 83 and 89 are arranged to abut each other when the first and second electrodes 82 and 24 are inserted into the aperture 36 and positioned similar to the positions of first and second electrodes 22 and 24 in FIG. 1. This insertion is indicated by insertion arrows 92 in FIGS. 6A and 6B. Preferably, the tabs 83 and 89 respectively define recesses 84 and 90 so that tab 83 is received into the recess 90 and tab 89 is received into the recess 84 as the tabs are brought into abutment.

The light display embodiment 80 is especially useful in lighting situations that require enhanced light intensity and in which it is desirable to have the reflector electrically connected to one of the electrodes. The electrical contact between the tabs 83 and 89 may then be enhanced with the application of solder or a conductive epoxy. The tabs 83 and 89 not only facilitate this electrical connection but further enhance the structural integrity of the connection.

Figure 7A:
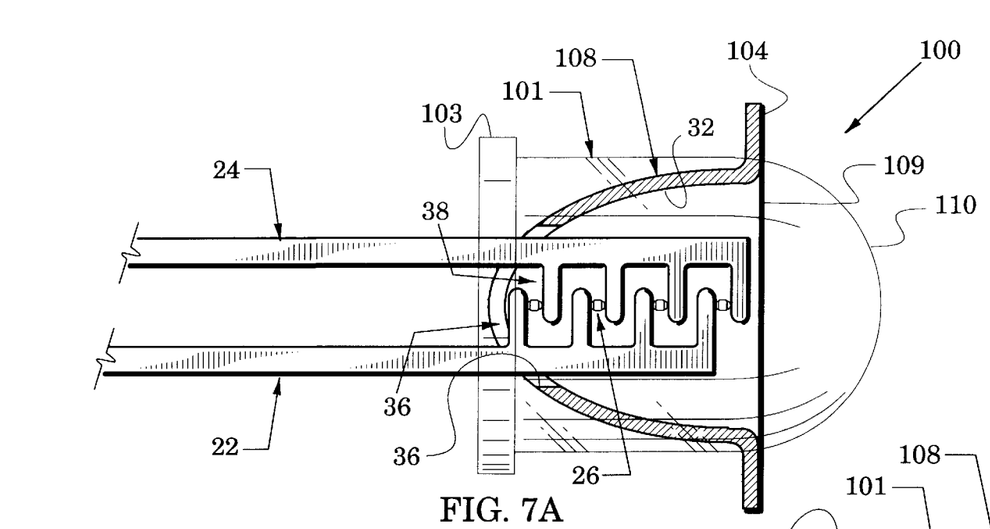
FIG. 7A is a partially-sectioned side view of another light display system embodiment.
Figure 7B:
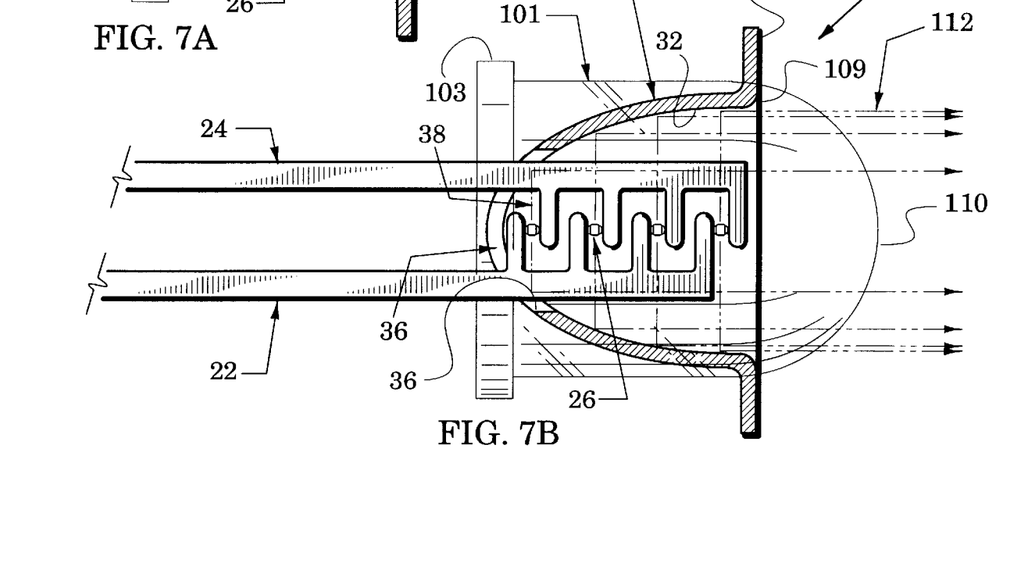
FIG. 7B illustrates exemplary light paths in the light display system embodiment of FIG. 7A.

FIGS. 7A and 7B illustrate another light display system embodiment 100 which is similar to the light display system 20 of FIG. 1 with like elements indicated by like reference numbers. In the light display system 100, however, the optical fiber 30 of FIG. 1 is replaced by an optically-clear encapsulation 101 that surrounds the first and second sets 36 and 38 of fingers and fills at least a portion of the reflecting chamber 32. Preferably, the encapsulation 101 also fills the aperture 36 and forms a cylindrical base 103 proximate to the aperture. Because the optical fiber 30 is not present, the light display 100 has a reflector 108 that replaces the collar 34 of FIG. 1 with a flange 104.

In one embodiment, the encapsulation 101 forms a face 109 that is substantially coplanar with the top of the flange 104. In another embodiment, the encapsulation 101 extends to define a lens 110 that can cooperate with the reflecting chamber 32 to focus light emitted from the light-emitting diodes 26. For example, FIG. 7B illustrates light rays 112 that are emitted by the diodes and collimated by a combination of reflection from the surface of the reflecting chamber 32 and refraction by the lens 112 (the refraction process is not indicated in FIG. 7B). This collimation is an exemplary one of a variety of focusing processes that may be obtained with the reflector 108 and the lens 112.

The light display embodiment 100 is especially useful in lighting situations that require enhanced light intensity but wish the light to be delivered proximate to the light-emitting diodes 26 rather than transmitted away via an optical fiber. The encapsulation 101 is preferably formed with any of various conventional "water-clear" polymers. Alternatively, tinted polymers can be used to enhance color of the emitted light. The flange 104 may be used in mounting the light display system 100 and also for conducting heat away from the system.

Figures 8A, 8B:
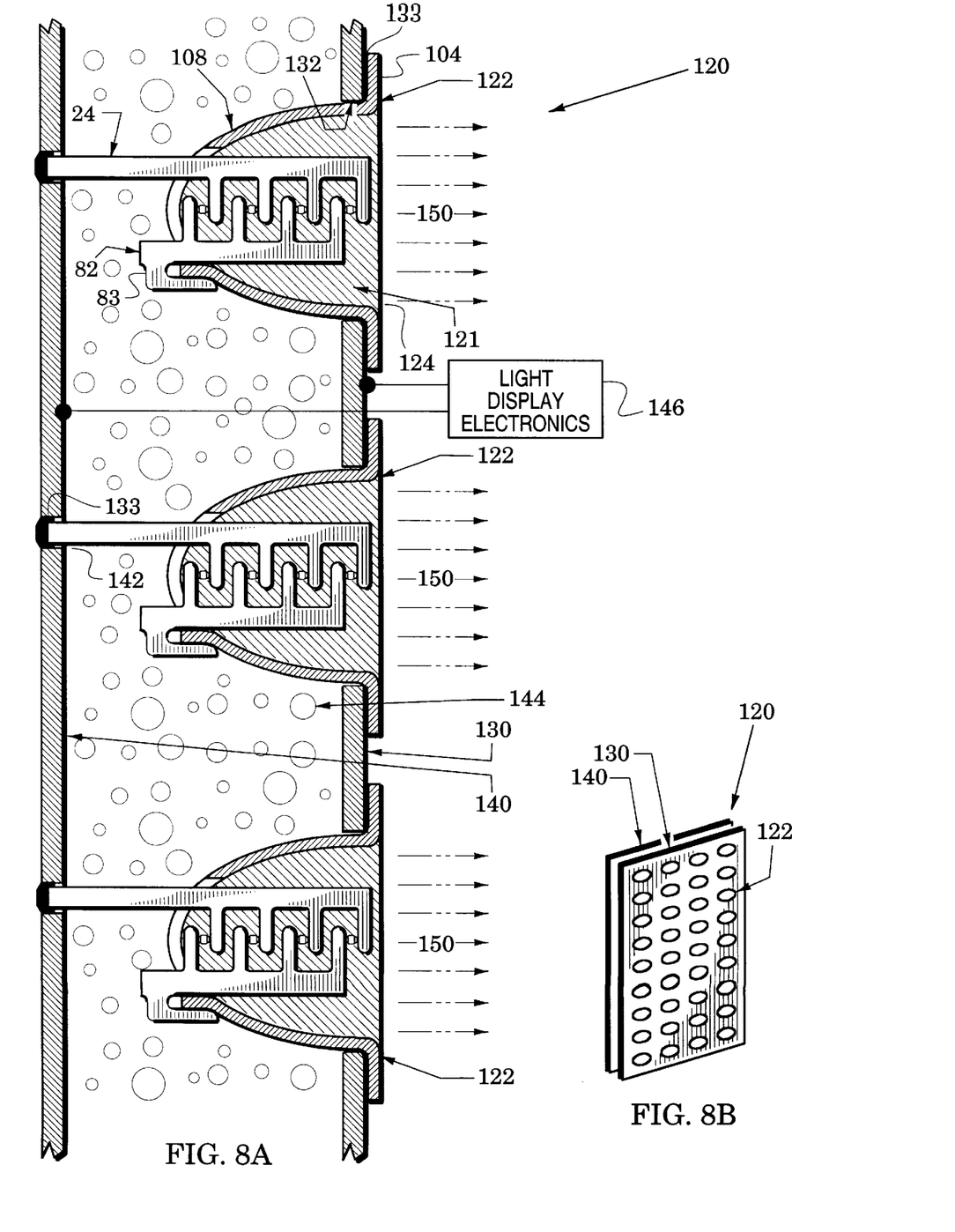
FIG. 8A is a sectional view of another light display system embodiment.
FIG. 8B is a reduced, perspective view of the light display system of FIG. 7A.

FIGS. 8A and 8B illustrate another light display system embodiment 120. This system includes a plurality of light displays 122 that are similar to the light display system 80 of FIGS. 6A and 6B but which replace the reflector 88 of this system with the reflector 108 of FIGS. 7A and 7B. Each of the light displays 122 include an optically-clear encapsulation 121 that fills the reflector 88 and forms a face 124 that is coplanar with the flange 104. The first electrode 82 of each of the light displays 122 is electrically coupled to its reflector 108 and is terminated proximate to the electrode's first tab 83.

A conductive first master electrode 130 receives each of the light displays 122 into a respective one of a plurality of apertures 132 and abuts the flange 104 of each of the displays. Preferably, a conductive medium 133 (e.g., solder or conductive epoxy) is inserted to enhance the electrical connection between the first master electrode 130 and the flanges 104.

A conductive second master electrode 140 is spaced from the first master electrode 130 to receive the second electrode 24 of each of the light displays 122 into a respective one of a plurality of apertures 142. A conductive medium 133 is preferably inserted to enhance the electrical connection between the second master electrode 140 and the second electrodes 24. The space between the first and second master electrodes 130 and 140 may be filled with air or with any of various conventional insulators 144 (e.g., polymers). A reduced scale perspective view of the light display system embodiment 120 is shown in FIG. 8B.

In operation of the light display system embodiment 120, a light display electronics 146 applies voltage potentials to the first and second master electrodes 130 and 140 to simultaneously activate the light-emitting diodes of all of the light displays 122. Accordingly, a light beam having enhanced light intensity is emitted from the light display system embodiment 120 as indicated by light rays 150 in FIG. 8A.

Figure 8C:
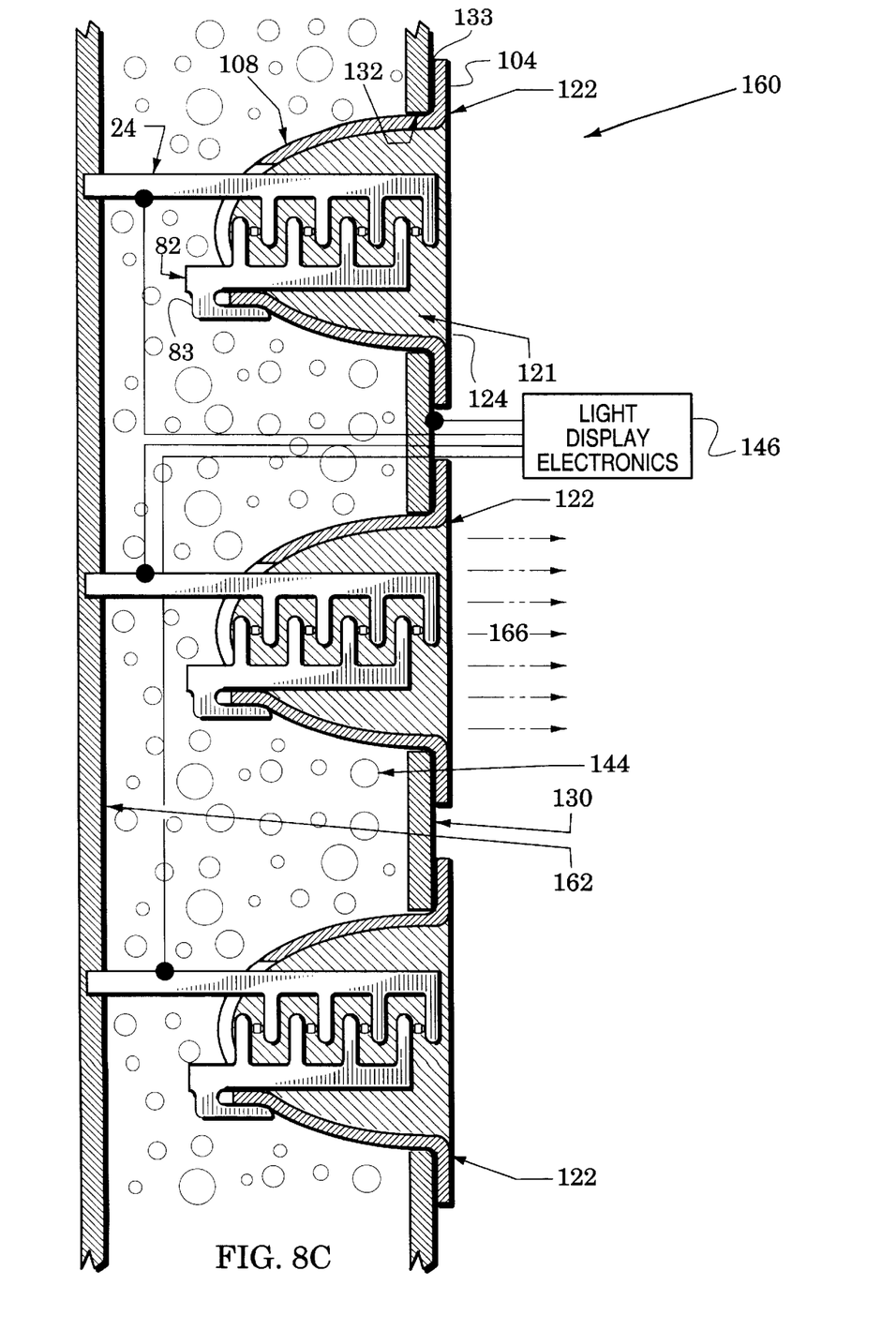
FIG. 8C is a sectional view of another light display system embodiment.

FIG. 8C illustrates another light display system embodiment 160 which is similar to the system 120 of FIGS. 8A and 8B but the conductive second master electrode 140 is replaced with an insulative second master electrode 162 that supports the ends of the second electrodes 24 of the light displays 122. In operation of this system, the light display electronics 146 can simultaneously activate the light-emitting diodes of all of the light displays 122 or can selectively activate them as indicated by light rays 166 that radiate from only one of the light displays.

The light display embodiment 120 is especially useful in light display situations that require substantially enhanced light intensity and can benefit from its low-voltage, rapid and rugged operation. Exemplary situations include vehicle stop lights, turn-indicator lights and upper and lower brake lights. Because the human eye cannot distinguish between a constant illumination and a rapidly-pulsed illumination, the efficiency of the light display embodiment 120 can be further enhanced by structuring the light display electronics 146 to apply electrical pulses at a suitable duty cycle (e.g., a 10:1 duty cycle).

The light display embodiment 160 is especially useful in light display situations that can benefit from its independently-controlled light displays 122. An exemplary situation is one in which symbols (e.g., letters and/or numbers) are to be selectively displayed. To further enhance this use, light displays 122 may be selected that emit different light colors.

The first and second master electrodes 130 and 140 (and 162) form convenient heat conduction paths that can transmit heat away from the light displays 122. Although shown in a parallel, planar arrangement in FIGS. 8A–8C, they may be formed in various planar and nonplanar embodiments to facilitate their use in various lighting situations. In another light display embodiment, one or both of the electrodes are configured as a conventional Peltier cooler which employs the Peltier effect to transfer heat away from the light-emitting diodes.

The first and second interdigitated electrodes of the light display system embodiments of the invention have been illustrated to have a coplanar relationship. This may be observed, for example, in FIGS. 6A and 6B which respectively show side and edge views of these electrodes as they are inserted into a reflector 88.

Figure 9A:
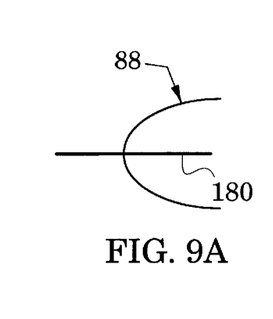
FIGS. 9A–9D are schematized edge views of other light display system embodiments.

FIG. 9A is a schematized view that is similar to FIG. 6B. In particular, this figure illustrates an edge view of the first and second electrodes 82 and 24 within their reflector 88. In this embodiment, the electrodes may be said to be arranged along a planar path 180. Both the electrodes and their interdigitated fingers are coplanar. The teachings of the invention, however, may be practiced with various other arrangements of these electrodes and their interdigitated fingers.

Figure 9B:
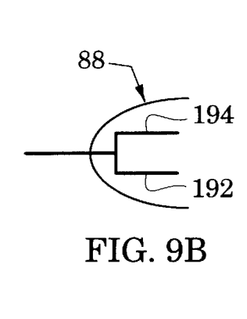
Figure 9C:
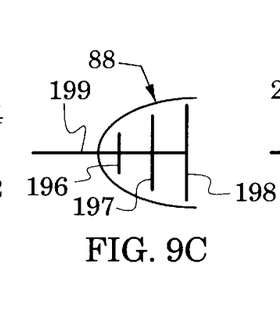

FIG. 9B, for example, illustrates an edge view of first and second electrodes within a reflector 88 wherein the electrodes are arranged along two paths 192 and 194 that are spaced from each other. In FIG. 9C the first and second electrodes are arranged along multiple paths 196, 197 and 198 that are carried on a transverse portion 199 of the electrodes.

Figure 9D:
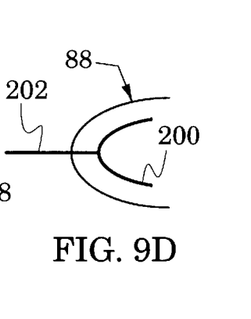

FIG. 9D illustrates that the electrodes are not limited to planar paths. In this figure, the first and second electrodes are arranged along a curved path 200 that is supported on an electrode portion 202. The paths of FIGS. 9A–9D illustrate that various planar and nonplanar path arrangements can be used to carry additional light-emitting diodes on interdigitated fingers to thereby further enhance the light intensity of the invention.

Figure 10A:
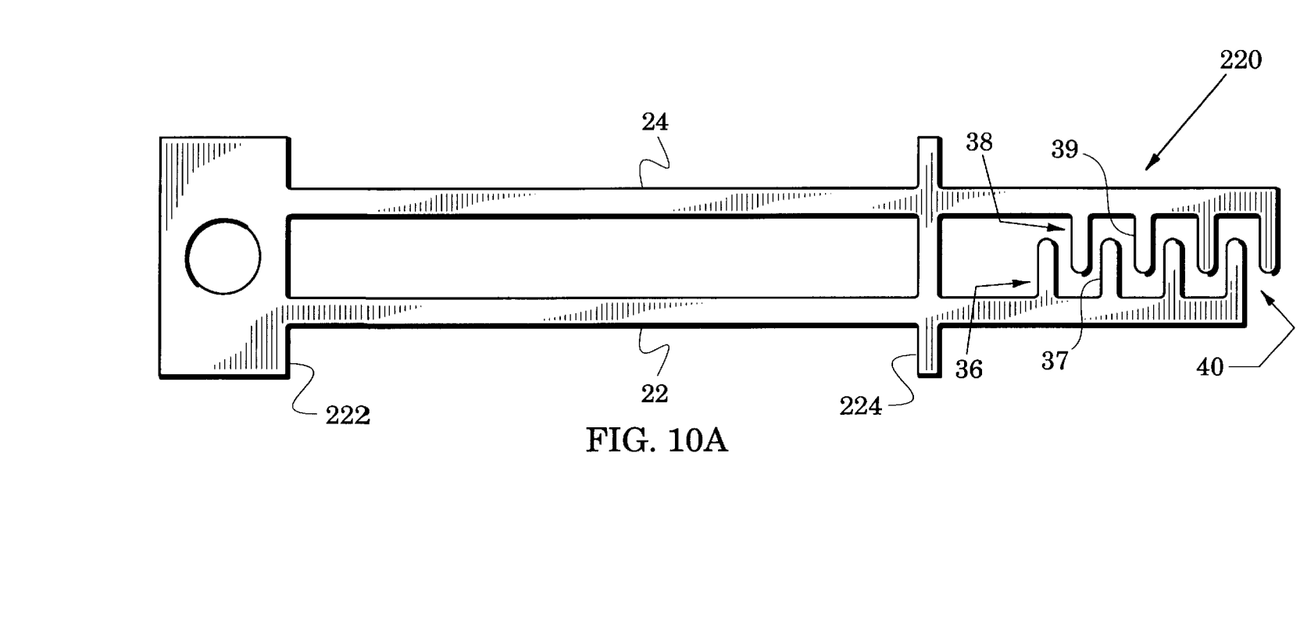
FIGS. 10A and 10B are side and edge views respectively of an electrode frame that includes the first and second electrodes of FIG. 1.
Figure 10B:
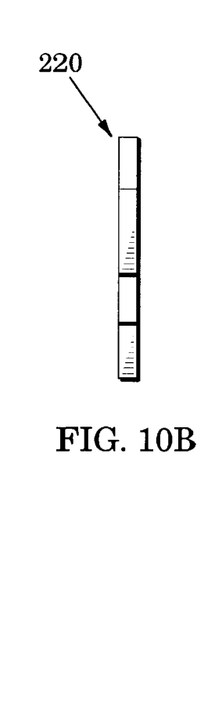

FIGS. 10A and 10B are respectively plan and edge views of first and second electrodes 22 and 24 similar to these electrodes in the view of FIG. 1. These views show the first and second sets 36 and 38 of first and second fingers 37 and 39 respectively in their interdigitated relationship 40. FIG. 10 shows that the electrodes can be initially formed as part of a frame 220. The frame includes transverse members 222 and 224 that support the electrodes 22 and 24 during fabrication and storage. Subsequently, the members 222 and 224 are removed during assembly into a light display such as the light display 20 of FIG. 1. The frame 220 can be formed of various conductive metals or alloys of conductive metals (e.g., copper and aluminum) and protected from corrosion with a metal film that is carried over a base metal.

Light display systems of the invention include first and second sets of first and second fingers that are arranged in an interdigitated relationship. This relationship facilitates positioning of multiple light-emitting diodes within reflectors to thereby enhance the light intensity of the light display systems.

Although an exemplary reflector has a parabolic shape, other light display system embodiments can be formed with various other reflector shapes and with various reflector surface configurations (e.g., faceted).

Standard references (e.g., *Mirriam Webster's Collegiate Dictionary*, Merriam-Webster, Inc, Springfield, Mass., tenth edition, 1993, see definition of interdigitate and Markus, John, et al., *McGraw Hill Electronics Dictionary*, McGraw-Hill, Inc, New York, fifth edition, 1994, see definition of interdigital structure) liken this relationship to that of interlocked or interleaved fingers of the hands. The terminology is conventionally used to refer to such relationships in various electronic structures (e.g., integrated-circuit devices).

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A light display system, comprising:
   first and second electrodes that respectively form first and second sets of first and second fingers respectively wherein said first and second fingers are arranged in an interdigitated relationship;
   a plurality of light emitting diodes that are each coupled between a respective one of said first fingers and a respective one of said second fingers; and
   a reflector arranged and positioned to reflect light from said light-emitting diodes.

2. The light display system of claim 1, wherein said first and second electrodes are substantially coplanar.

3. The light display system of claim 1, wherein said first and second sets are substantially coplanar.

4. The light display system of claim 1, further including solder that electrically couples each of said light emitting diodes to its respective first finger and to its respective second finger.

5. The light display system of claim 1, further including conductive epoxy that electrically couples each of said light emitting diodes to its respective first finger and to its respective second finger.

6. The light display system of claim 1, wherein said reflector is electrically coupled to one of said electrodes.

7. The light display system of claim 6, wherein:
   one of said first electrode and said reflector forms a first tab;
   the other of said first electrode and said reflector forms a second tab; and
   said first and second tabs are abutted to electrically couple together said first electrode and said reflector.

8. The light display system of claim 1, wherein said reflector has a substantially parabolic shape.

9. The light display system of claim 1, further including an optically-clear encapsulation that surrounds said first and second sets and fills at least a portion of said reflector.

10. The light display system of claim 9, further including a lens formed by said polymer.

11. A light display system, comprising:
   first and second electrodes that respectively form first and second sets of first and second fingers respectively wherein said first and second fingers are arranged in an interdigitated relationship;
   a plurality of light emitting diodes that are each coupled between a respective one of said first fingers and a respective one of said second fingers;
   a reflector arranged about said light-emitting diodes; and
   an optical fiber coupled to said reflector to receive light from said light-emitting diodes.

12. The light display system of claim 11, wherein said first and second electrodes are substantially coplanar.

13. The light display system of claim 11, wherein said first and second sets are substantially coplanar.

14. The light display system of claim 11, further including solder that electrically couples each of said light emitting diodes to its respective first finger and to its respective second finger.

15. The light display system of claim 11, further including conductive epoxy that electrically couples each of said light emitting diodes to its respective first finger and to its respective second finger.

16. The light display system of claim 11, wherein said reflector is electrically coupled to one of said electrodes.

17. The light display system of claim 16, wherein:
   one of said first electrode and said reflector forms a first tab;
   the other of said first electrode and said reflector forms a second tab; and
   said first and second tabs are coupled to electrically couple together said first electrode and said reflector.

18. The light display system of claim 11, wherein said reflector has a substantially parabolic shape.

19. The light display system of claim 11, wherein said optical fiber includes a light-emitting structure which enhances light emission from said optical fiber.

20. The light display system of claim 19, wherein said optical fiber includes a core and a cladding about said core and said light-emitting structure comprises an elongate reflector within said cladding.

21. The light display system of claim 19, wherein said optical fiber includes a core and a cladding about said core and said light-emitting structure comprises elongate perturbations formed in association with said cladding.

22. The light display system of claim 11, wherein said reflector forms an annular collar which receives said optical fiber.

23. A light display system, comprising:
   a plurality of light sources that each include:
   a) first and second electrodes that respectively form first and second sets of first and second fingers respectively wherein said first and second fingers are arranged in an interdigitated relationship;
   b) a plurality of light emitting diodes that are each coupled between a respective one of said first fingers and a respective one of said second fingers; and c) a reflector arranged and positioned to reflect light from said light-emitting diodes;
a first master electrode that is electrically coupled to the first electrode of at least one of said light sources; and
a second master electrode that is electrically coupled to the second electrode of at least one of said light sources.

24. The light display system of claim 23, further including solder that electrically couples each of said light emitting diodes to its respective first finger and to its respective second finger.

25. The light display system of claim 23, further including conductive epoxy that electrically couples each of said light emitting diodes to its respective first finger and to its respective second finger.

26. The light display system of claim 23, wherein said first master electrode is electrically coupled to the first electrode of all of said light sources and said second master electrode is electrically coupled to the second electrode of all of said light sources.

27. The light display system of claim 23, wherein in each of said light sources:
a) one of said first electrode and said reflector forms a first tab;
b) the other of said first electrode and said reflector forms a second tab; and
c) said first and second tabs are coupled to electrically couple together said first electrode and said reflector; and
the reflector of each of said light sources is electrically coupled to said first master electrode.

28. The light display system of claim 27, wherein said second master electrode forms a plurality of apertures that each receive one of said reflectors.

29. The light display system of claim 23, wherein said reflector has a substantially parabolic shape.

30. The light display system of claim 23, further including an optically-clear polymer that surrounds said first and second sets and fills at least a portion of said reflector.

31. A method of displaying light, comprising the steps of:
arranging first and second electrode sets of first and second fingers in an interdigitated relationship;
coupling each of a plurality of light-emitting diodes between a respective one of said first fingers and a respective one of said second fingers; and
reflecting the light from said light-emitting diodes to form a composite light beam.

32. The method of claim 31, further including the step of receiving said composite light beam into an optical fiber.

33. The method of claim 32, further including the step of modifying said optical fiber to enhance its light emission.

* * * * *